United States Patent [19]
Brown et al.

[11] Patent Number: 5,381,442
[45] Date of Patent: Jan. 10, 1995

[54] COHERENT FOURIER TRANSFORM RADIOMETER FOR DETERMINING THE THICKNESS DISTRIBUTION OF AN OIL FILM ON A BODY OF WATER BASED ON THE BRIGHTNESS TEMPERATURE OF THE OIL FILM AND WATER OVER A RANGE OF RADIATION FREQUENCIES

[75] Inventors: Elliott R. Brown, Billerica; Gregory G. Hogan, Stowe; Gerald M. Daniels, Norwood, all of Mass.

[73] Assignee: Massachusetts Institute of Technology, Cambridge, Mass.

[21] Appl. No.: 41,728

[22] Filed: Apr. 1, 1993

[51] Int. Cl.⁶ .................. G01N 25/00; G01B 11/06
[52] U.S. Cl. ..................... 374/7; 364/563; 364/576
[58] Field of Search ............ 374/6, 7, 120, 124, 374/122; 364/563, 576

[56] References Cited

U.S. PATENT DOCUMENTS

| | | | |
|---|---|---|---|
| 4,396,595 | 8/1982 | Gary | 374/122 |
| 4,818,118 | 4/1989 | Bantel et al. | 374/7 |
| 5,166,080 | 11/1992 | Schietinger et al. | 374/7 |
| 5,258,824 | 11/1993 | Carlson et al. | 374/7 |

FOREIGN PATENT DOCUMENTS

| | | | |
|---|---|---|---|
| 0282756 | 9/1990 | Germany | 374/7 |
| 1395939 | 5/1988 | U.S.S.R. | 374/7 |

OTHER PUBLICATIONS

"The Determination of Oil Slick Thickness by Means of Multifrequency Passive Microwave Techniques", James P. Hollinger, Naval Research Lab., Jun. 30, 1974, 1–139 & i,ii,iii.

"The Remove Sensing of Oil Slicks", Proceedsings of Int'l Meeting by Institute of Petroleum, London, May 1988, pub. John Wiley & Sons., pp. 7–65, 86–103.

"Microwave Radiometry for Oil Pollution Monitoring, Measurements, and Systems", *IEEE Transactions on Geoscience and Remote Sensing*, vol. GE–24, No. 3, May 1986, pp. 360–367.

"Microwave Mixers", Stephen A. Maas, pp. 138–141, (1986).

"Microwave Radiometric Detection and Imaging of Oil Spills on the Sea", Hashimoto et al., Fourth Thematic Conf., Apr. 1–4, 1985, pp. 557–564.

*Primary Examiner*—Diego F. F. Gutierrez
*Attorney, Agent, or Firm*—Hamilton, Brook, Smith & Reynolds

[57] ABSTRACT

A radiometer is described which coherently detects the thickness of oil films on water by converting continuous-frequency microwave or millimeter-wave brightness temperature versus frequency measurements from the frequency/wavenumber domain to the oil-film-thickness domain (received power versus film thickness) using Fourier-transform signal processing.

20 Claims, 5 Drawing Sheets

COHERENT FOURIER TRANSFORM RADIOMETER FOR DETERMINING THE THICKNESS DISTRIBUTION OF AN OIL FILM ON A BODY OF WATER BASED ON THE BRIGHTNESS TEMPERATURE OF THE OIL FILM AND WATER OVER A RANGE OF RADIATION FREQUENCIES

GOVERNMENT SUPPORT

The Government has rights in this invention pursuant Contract/Grant No: 449-4-201, the U.S. Coast Guard Research and Development Center.

BACKGROUND OF THE INVENTION

Sea surface oil spills do not spread uniformly, nor without limit. Thick regions having a thickness of a millimeter or more are formed, which contain the majority of the oil. Reliable detection of oil thickness is of major importance. A knowledge of the oil distribution, and the location of those regions containing the heaviest concentration of oil, would enable the most effective confinement, control and clean-up of the oil.

Multifrequency microwave radiometry has heretofore been employed as a technique for determining oil thicknesses greater than about 1 mm. ("The Determination of Oil Slick Thickness by Means of Multifrequency Passive Microwave Techniques" James P Hollinger, *NRL Memorandum Report* 2953, June 1974.) This technique is based upon the fact that the apparent microwave brightness temperature is different in the region of the oil slick than in the adjacent unpolluted sea by an amount which depends upon the slick thickness. The oil slick acts as an electromagnetic matching layer between free space and the sea, modulating the brightness temperature of the sea. As the thickness of the oil slick is increased, the apparent microwave brightness temperature at first increases and then passes through alternating maxima and minima, due to the standing wave pattern set up in the film. The adjacent maxima and minima are separated by integral multiples of a quarter of the electromagnetic wavelength in the oil.

Heretofore, the use of microwave radiometry for oil slick thickness measurement has been hindered by several drawbacks in the technology. Chief among these difficulties are the inability to achieve thickness resolution below about 1 mm and the inability to unambiguously measure oil slicks containing a range of thicknesses.

A need exists, therefore, for an improved microwave radiometer capable of achieving better thickness resolution and having the ability to discriminate unambiguously different thicknesses of oil contained within a given radiometric antenna pattern.

SUMMARY OF THE INVENTION

In general, the invention is comprised of a radiometer which detects the electromagnetic energy radiated by a body of water having a film of oil on its surface. The radiometer detects the energy as a brightness temperature over a range of radiation frequencies and converts the detected frequency-domain spectrum to a spectrum of radiation power versus film thickness. This conversion is accomplished by Fourier transform signal processing and results in an unambiguous film-thickness distribution measurement over a large thickness range.

DETAILED DESCRIPTION OF THE INVENTION

Figure 1A:
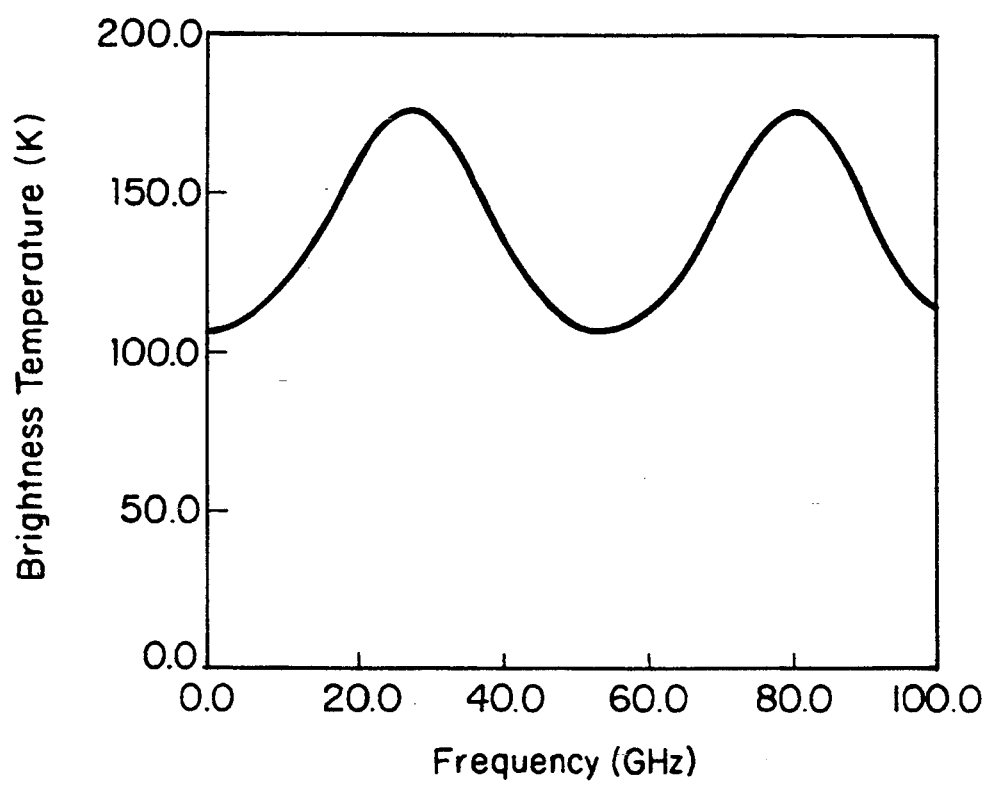
FIG. 1A is an example of a brightness-temperature curve for a uniform oil film of 0.2-cm thickness.

The electromagnetic power emitted by a large body of water into the atmosphere above it can be estimated by basic principles of radiative transport theory. In the microwave and millimeter-wavelength spectral regions, the atmosphere is quite transparent except for the absorption arising from water vapor and a few other molecular species. Ignoring these effects, we estimate that the power emitted from the water is the same as that from a blackbody having a temperature equal to the physical temperature of the water, $T_w$, and an emissivity $\epsilon_w$ given by Kirchoff's relation [2], $\epsilon_w \approx 1-r$, where r is the radiation reflectance between the water and air. The emitted power is thus described by the brightness temperature, $T_B \approx \epsilon T_w$. In the absence of the oil film, $r \approx (n_w-1)^2/(n_w+1)^2$, where $n_w$ is the refractive index of the water. Because $n_w$ is much greater than 1 in the microwave region, r is close to unity and $T_B$ is much less than $T_w$.

In the presence of an oil film, the emissivity is modulated by the process of multiple-pass interference of radiation in the film. This is a well-known phenomenon in classical optics. Because the refractive index of oil, $n_o$, in the microwave and millimeter-wave regions is much less than that of water, the emissivity can be substantially increased in certain frequency ranges and decreased in others by a reduction and enhancement, respectively, in the overall reflectance between the water and the air. This is similar to the effect of an intermediate-refractive-index anti-reflection coating on optical components. The result is an overall reflectance of:

$$r \approx 1 - t \approx 1 - \frac{t_a t_w}{1 + 2\sqrt{r_a r_w}\cos 2n_o kh + r_a r_w} \quad (1)$$

where $r_a$ and $r_w$ are the reflectances at the oil-air and oil-water interfaces, respectively, $t_a$ and $t_w$ are the transmittances at the oil-air and oil-water interfaces, respectively, k is the free-space wave vector of the radiation, and h is the oil-film thickness.

In the microwave region $r_w$ is roughly 0.5 but $r_a$ is much closer to zero since $r_a = (r_o-1)^2/(n_o+1)^2$ and $n_o$ is approximately 1.5. With this in mind, we can expand Equation 1 with respect to $\sqrt{r_a}$ to obtain:

$$r \approx 1 - t_w(1 - r_a + r_a r_w - 2\sqrt{r_a r_w}\cos 2nkh) + \ldots \quad (3)$$

The brightness temperature is thus approximated by:

$$T_B \approx T_W t_w (1 - r_a + r_a r_w - 2\sqrt{r_a r_w} \cos 2nkh) + \ldots, \quad (4)$$

The approximate expression for $T_B$ given by Equation 3 can be written as:

$$T_B \approx T_w (a + b \cos 2nkh). \quad (5)$$

To the extent that the parameters a and b are independent of frequency, the film thickness can be determined uniquely by Fourier transformation of Equation 4 from the wavenumber/frequency domain to the thickness domain. This fact is the basis for the signal processing carried out in accordance with the present invention. To illustrate this signal processing method, we carry out the Fourier cosine transform for a single film of thickness h under the assumption that the brightness curve is band-limited from 0 to $\omega_{max}$ where $\omega_{max} = k_{max} c$ and c is the speed of light in air. In this case, $$T_B = \sqrt{\frac{2}{\pi}} \int_0^{k_{max}} T_B(k) \cos kx \, dk, \quad (6)$$

where x is the thickness variable. Substituting in the cosine term of Equation 5 and evaluating the integral, we find the following expression for $T_B$:

$$T_B = \frac{bT_W}{\sqrt{2\pi}} \left[ \frac{\sin \omega_{max}(2n_o h - x)/c}{2n_o h - x} + \frac{\sin \omega_{max}(2n_o h + x)/c}{2n_o h + x} \right]. \quad (7)$$

The first term is a sinc function, defined by sinc(x)=sin(x)/x, that has a peak of unit magnitude at $x = 2n_o h$. The second term will be negligible for $x > 0$ provided that $k_{max}(2n_o h + x)$ is greater than or equal to $\pi$.

A quantity of great practical importance is the thickness resolution $\delta h$. By definition, this is the minimum difference in thickness that two oil films can have and still be discriminated in accordance with the invention. Assuming that only the first term of Equation 7 is significant, we can define $\delta h$ using Rayleigh's criterion. This criterion states that two films of thickness $h_1$ and $h_2$, respectively, will be just discriminated when the first zero of the sinc function for one film lies at the same x as the peak of the sinc function of the other film. Equivalently, $\delta h$ is the separation in the thickness domain between the peak of the sinc function and its first zero. The first zero away from the peak is given by $\omega_{max}(2n_o h_1 - x)/c = \pm \pi$. The separation between either of these zeros and the peak is $\delta x = c/2f_{max}$. This separation corresponds to a difference in oil thickness of:

$$\delta h = \frac{\delta x}{2n_o} = \frac{c}{4n_o f_{max}}. \quad (8)$$

For example, with $n_o = 1.5$, we find $\delta h = 1.25$ and 0.5 mm for $f_{max} = 40$ and 100 GHz, respectively.

Figure 1B:
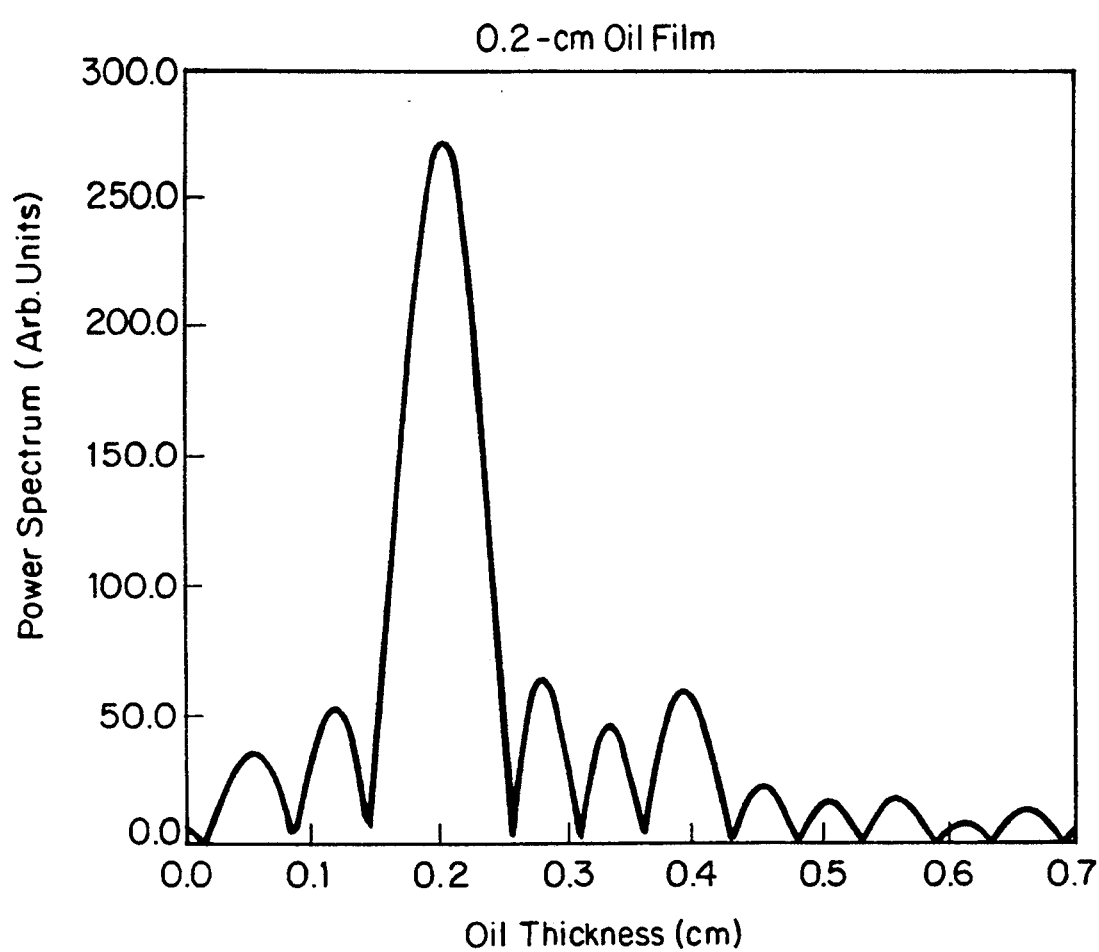
FIG. 1B is an oil-film power spectrum obtained by Fourier transforming the curve in FIG. 1A from the frequency domain to the thickness domain, in accordance with the invention.

To illustrate the Fourier-transform spectroscopy, we first consider a uniform film having a thickness of 2 mm and the parameters $r_a = 0.03$, $r_w = 0.5$, $t_a = 1 - r = 0.97$, and $t_w = 1 - r_w = 0.5$ and $f_{max} = 100$ GHz. The curve of $T_B$ versus f, as calculated from Equation 1, is shown in FIG. 1A under the assumption that $T_w = 280$ K. As expected, it is quasi-sinusoidal and upon Fourier transformation yields the power spectrum in FIG. 1B. The side-lobes of the sinc function are a distraction to the eye, but do not affect the correct location of the peak at $h \approx 0.2$ cm. In principle, these side-lobes could be greatly suppressed by apodizing the $T_B$ curve before Fourier transformation. The penalty of apodization is that it increases $\delta h$, so that it is not an acceptable procedure when the thickness resolution must be minimized.

Figure 2A:
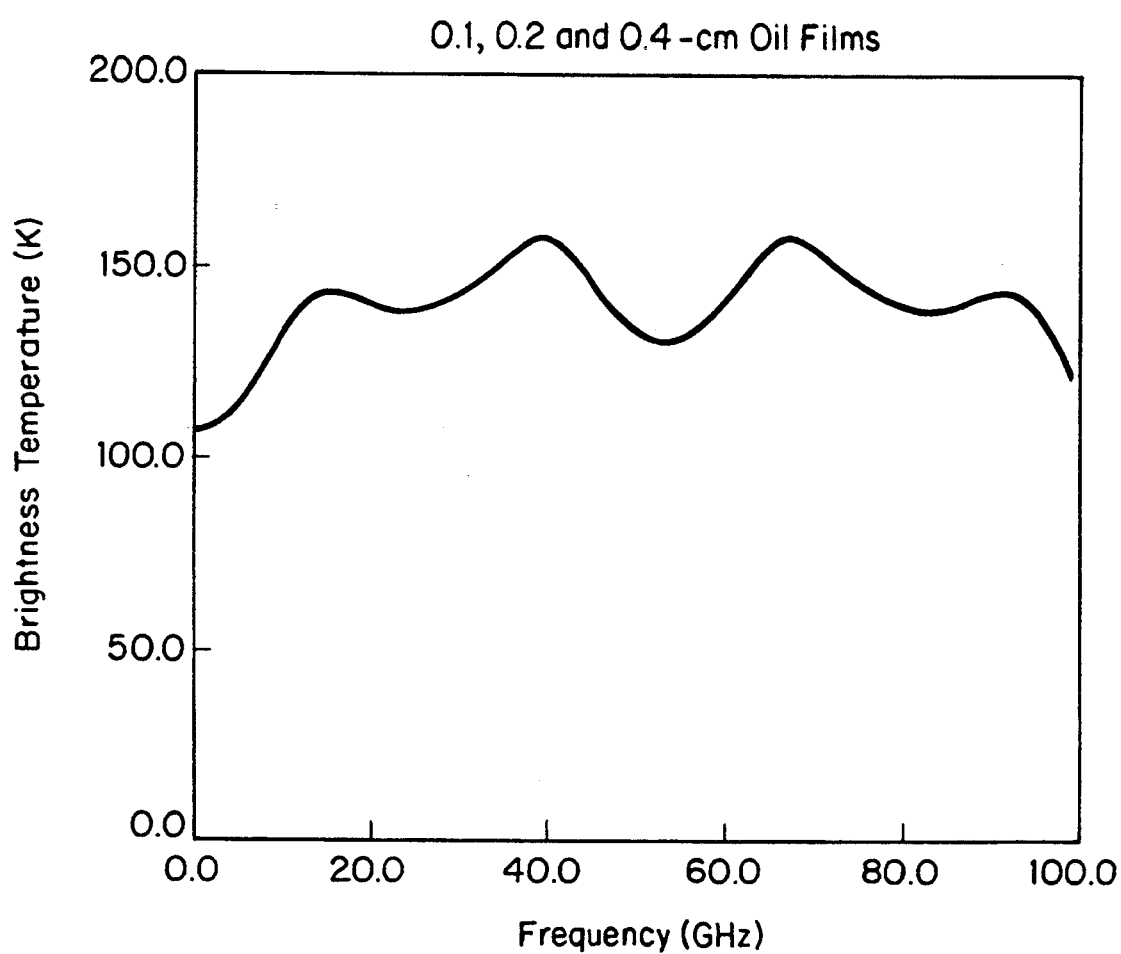
FIG. 2A is a computer generated brightness-temperature curve for an oil film containing equal-area patches having 0.1-, 0.2- and 0.4-cm thickness.
Figure 2B:
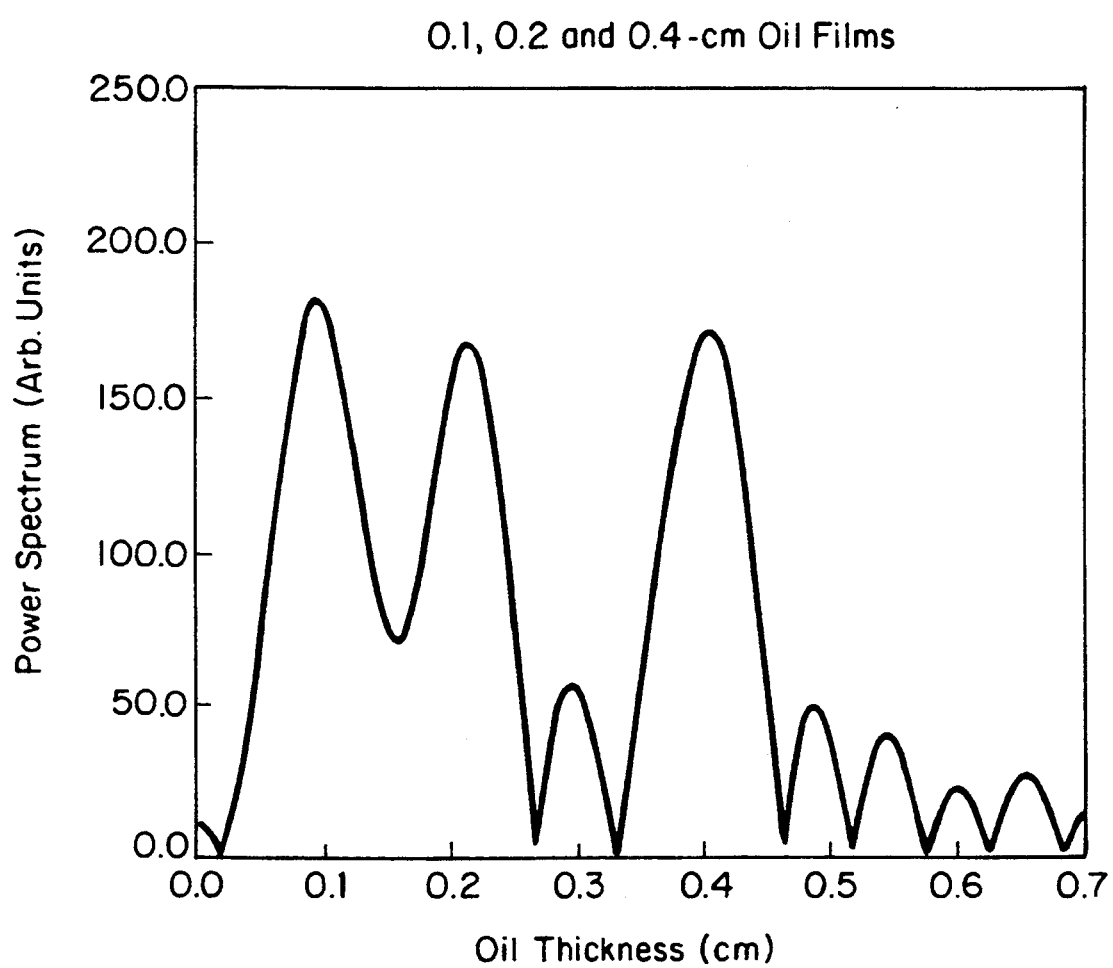
FIG. 2B is an oil-film power spectrum obtained by Fourier transforming the curve in FIG. 2A. The three peaks occur at the associated oil-film thicknesses.

A second and more convincing illustration of the Fourier-transform method is to consider three separate films of thickness $h_1$, $h_2$ and $h_3$ distributed equally within the radiometer beam. Assuming the same reflection and transmission parameters as above and $h_1 = 1$ mm, $h_2 = 2$ mm, and $h_3 = 4$ mm, we obtain the $T_B$ curve in FIG. 2A. Because of the mixing between the quasi-sinusoidal curves of the three films, the brightness curve is convoluted. However, the Fourier cosine transform deconvolves the brightness curve and yields three clearly discernible peaks in FIG. 2B at the correct oil-film thicknesses. Of course, a difference in the distribution of the three films would be manifested in the thickness domain by a difference in the corresponding peak magnitudes of the power spectrum.

Because of limitations on observation time, it is impractical to obtain the continuous brightness temperature curve of an oil film across any significant fraction of the millimeter-wave region (defined as 30 to 300 GHz). Therefore, the system of the invention measures the radiation at discrete frequencies separated by some frequency interval $\Delta \omega$. By Nyquist's famous sampling theorem, the thickest oil film $h_N$ that can be measured without ambiguity (i.e., without aliasing) is the one whose $T_B$ curve displays one-half cycle over $\Delta \omega$. The so-called Nyquist thickness $h_N$ thus satisfies $\cos 2 n_o \Delta \omega h_N / c = -1$, which leads to:

$$h_N = \frac{c}{4n_o \Delta f}. \quad (9)$$

As an example, with $n_o = 1.5$ and $\Delta f = 1$ GHz, we find $h_N = 5$ cm. The maximum oil-film thickness anticipated in practice is about 1.5 cm, so that a 1 GHz interval will easily prevent ambiguity in the measurement.

To more completely understand the ambiguity problem faced by radiometers prior to the present invention, we assume that $T_B$ is measured at only one frequency $f_m$. Since $T_B$ is known for all possible thicknesses at $f = 0$ by the phenomenology discussed above, the effective frequency interval in this case is $f_m$. This yields a Nyquist thickness of $c/4n_o f_m$. For example, a radiometer operating at 40 GHz provides an $h_N$ of only 1.25 mm. Any film having thickness greater than or equal to $h_N$ will be measured with great ambiguity.

Ideally, the brightness temperature curve should be sampled at roughly 1-GHz frequency intervals from zero up to a maximum frequency that provides a thickness resolution less than the thinnest oil film of interest. The thinnest oil film is approximately 0.5 mm. From the example given above, an $f_{max}$ of 100 GHz is required to achieve this resolution. In practice, it is very difficult to obtain complete radiometric data in the band covering 0 to 100 GHz because of atmospheric absorption, particularly the $H_2O$ line near 22 GHz and the $O_2$ line near 60 GHz. Other limiting factors are the complexity and expense of the instrumentation required to cover such a wide frequency range. To alleviate these difficulties, the preferred embodiment of the invention is operated in the two spectral subbands from 26 to 40 GHz and from 75 to 100 GHz. Combined with the knowledge of $T_B$ by default at f=0, the information in the two spectral subbands can be used to determine the unknown brightness temperature in the frequency gaps between 0 and 26 GHz and between 40 and 75 GHz by interpolation. The methods of linear-prediction theory, such as least-square fitting to polynomials, are well suited for this interpolation because $T_B$ will be sampled at many frequencies in each subband. This will make it possible to interpolate using a polynomial, or some other functional series containing many terms. As a general rule, the accuracy of the interpolation increases with the number of terms in the series.

Linear-prediction methods are well suited to digital computers. They generally involve heavy application of techniques in linear algebra, such as matrix manipulation and determinant calculation. These techniques are readily and quickly carried out on digital computers using any higher-level language that supports multi-dimensional arrays. It is advantageous for the present invention that such computers have recently advanced to the point that linear prediction methods can be carried out very quickly. For example, microcomputers based on the RISC architecture can now carry out linear algebraic calculations at the rate of approximately 10 million floating-point operations per second. This level of computation speed would allow the signal processing associated with the present invention to be carried out in real-time or, at worst, pseudo real-time.

Historically, radiometry in the millimeter-wave region has been conducted primarily by the coherent, or heterodyne detection technique in a relatively narrow spectral bandwidth equal to roughly 2% of the center frequency. The present invention also uses heterodyne detection, but over a very broad frequency range of 30 to 40% of the center frequency. The critical function in the heterodyne technique is the down-conversion of radiation of interest to a much lower frequency where signal processing can be readily performed. The down-conversion process occurs by mixing the incident radiation with the coherent radiation from a local oscillator (LO) to generate a signal at the difference frequency (OF). In the present invention, down-conversion is required for only one (the upper) of the two possible sidebands.

Figure 3:
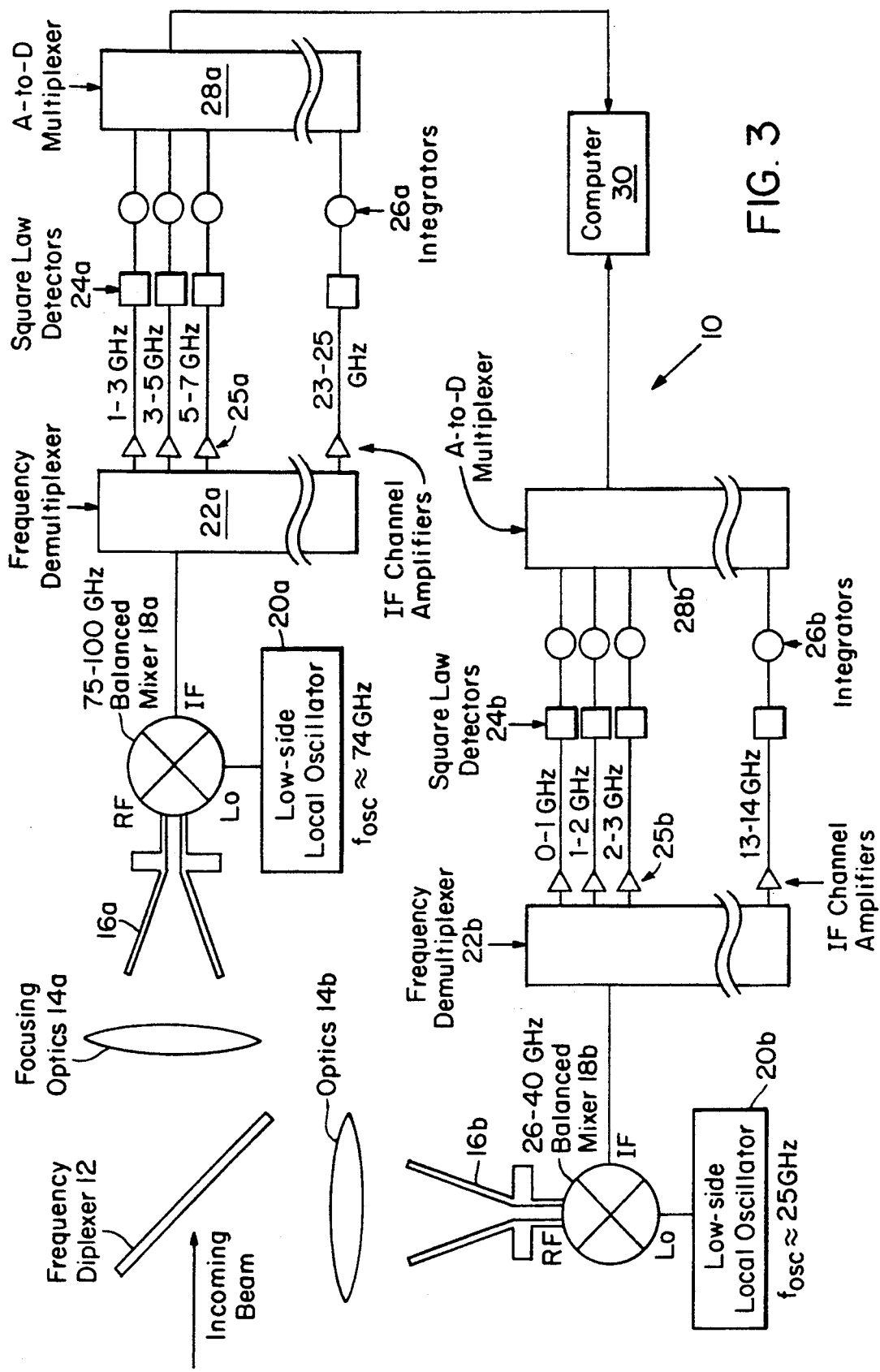
FIG. 3 is a schematic diagram of a preferred embodiment of the invention.

FIG. 3 is a schematic of a preferred embodiment of a Coherent Fourier Transform Radiometer (CFTR) of the invention, which operates over two wide spectral subbands of 26–40 GHz (Subband A) and 75–100 GHz (Subband B). The input beam from a body of water covered with oil is separated into the subbands by diplexer 12, which may comprise an inductive-mesh high-pass filter with a cut-on frequency at about 60 GHz. The mesh filter is mounted at 45° with respect to the input beam. Focusing optics 14a and 14b, placed between the mesh and receiver feedhorns 16a, 16b, allow the antenna patterns of the two subband receivers to be made nearly equal. This is important because the validity of interpolating in the frequency gap between 40 and 75 GHz demands that the $T_B$ curves for the two subbands correspond to the same area on the oil film being observed.

To operate over the wide spectral subbands of 26–40 GHz and 75–100 GHz, the CFTR uses waveguide single-balanced mixers 18a and 18b and fixed frequency local oscillators 20a and 20b operating just above the cutoff frequency of the waveguide, and a wide OF band containing several channels. In both receivers, the down-converted power in each OF band is frequency demultiplexed into the channels using demultiplexers 22a and 22b, amplified in low-noise channel amplifiers, 25a and 25b, square-law detected in detectors 24a, 24b, analog averaged in integrators 26a, 26b, digitized by A/D converters 28a, 28b, and then processed by a common computer 30. The frequency interval between channels is chosen to be great enough to allow for high sensitivity within each channel, but fine enough to provide a Nyquist thickness well above the maximum anticipated thickness in the oil film. In the preferred embodiment of FIG. 3, the frequency intervals are 1 and 2 GHz in the 26–40 and 75–100 GHz receivers, respectively. As shown in the above example, a frequency interval of 1 GHz provides a Nyquist thickness of 5 cm. In the typical situation, where the oil films have already spread well below 1 cm thickness, the frequency intervals should be increased accordingly. For example, the 26–40 GHz subband could be sampled in five channels separated by 3-GHz intervals with an $h_N$ of approximately 1.7 cm and still allow for a five-term polynomial or functional series in the interpolation procedure. The advantages of increasing the frequency interval are that the frequency demultiplexer then operates more simply and effectively and the observation time decreases, as explained below.

The computer 30 processes the digital data from the A-to-D multiplexers 28a and 28b by calculating the Fourier transform. There are a number of standard computer software packages available that can calculate the Fourier transform or, alternatively, custom routines can be written. In either case, the transformation is similar algorithmically to the Fast Fourier Transform first described by Cooley and Tukey in their famous paper in 1965, "An Algorithm for the Machine Calculation of Complex Fourier Series". The calculation of the Fourier transform for the determination of oil film thickness will be carried out in the computer in real time or pseudo real-time as the CFTR collects data. The resulting thickness distribution will be displayed and simultaneously recorded for further analysis and archival purposes.

The sensitivity of the CFTR, like all total-power radiometers, is characterized in the microwave and millimeter-wave regions by the minimum detectable temperature $\Delta T$. By definition, this is the brightness temperature present at the input to the radiometer that would yield a signal-to-noise ratio of unity after square-law detection and analog averaging. It is given by:

$$\Delta T = \frac{CT_R}{\sqrt{B_C \tau}}, \tag{10}$$

where $T_R$ is the receiver noise temperature, $B_c$ is the channel OF bandwidth, T is the analog integration time, and C is a constant of order unity, henceforth assumed to equal 1.0. $T_R$ is a function of the noise introduced by the OF preamplifier, losses in the coupling of radiation from the atmosphere into the mixer, losses in the mixer frequency down-conversion, and losses in the frequency demultiplexer. In the two proposed subbands of the CFTR, the radiation coupling and demultiplexer losses should be small compared to the mixer single-sideband conversion loss L. In this case, one can write:

$$T_R \approx T_{MIX} + LT_{IF}, \quad (11)$$

where $T_{MIX}$ is the mixer noise temperature and $T_{IF}$ is the preamplifier noise temperature.

To illustrate these characteristics, we evaluate the expected receiver performance in the two subbands using components that are available commercially. In the 26–40 GHz subband, single-balanced GaAs-based Schottky-diode mixers manufactured by Watkins-Johnson operate with $T_{MIX} \approx 800$ K and $L \approx 6$ dB averaged across the band. Room-temperature GaAs-FET-based OF channel amplifiers made by MITEQ display $T_{IF} \approx 75$ K (1.0-dB noise figure) when operating with a channel bandwidth of 1 GHz at center frequencies up to about 12 GHz. Putting this altogether, we find $T_R \approx 1100$ K. In the 75–100 GHz subband, another Watkins-Johnson single-balanced mixer typically displays $T_{MIX} \approx 1500$ K and $L \approx 8$ dB averaged across the band and the OF channel amplifiers will be the same, so that $T_R \approx 2000$ K.

Now suppose that we wish to measure $T_B$ curves in the two subbands with 1-GHz wide OF channels and a signal-to-noise ratio of 100. From FIGS. 1a and 2a, we observe that the average brightness temperature (i.e., the average signal) in the subbands is roughly 130 K, so that a $\Delta T$ of 1.3 K is required from the two receivers. In the 26–40 and 75–100 GHz receivers, this means that the integration time must be 0.7 and 2.4 ms, respectively.

Equivalents

Those skilled in the art will know, or be able to ascertain using no more than routine experimentation, many equivalents to the specific embodiments of the invention described herein.

These and all other equivalents are intended to be encompassed by the following claims.

The invention claimed is:

1. A radiometer for determining the thickness distribution of an oil film on a body of water comprising:
   a) a receiver for detecting the electromagnetic power radiated by the body of water and oil film by sampling the radiated power over a range of frequencies, and for generating therefrom a first electrical signal proportional to a brightness temperature of the water and film versus radiation frequency; and
   b) a signal processing means for processing the first electrical signal by a Fourier transform process to obtain a second electrical signal, which second electrical signal is proportional to radiative power versus film thickness.

2. The radiometer of claim 1 wherein the radiated power is detected over a continuous range of frequencies.

3. The radiometer of claim 1 wherein the radiated power is coherently detected over a continuous range of frequencies in two subbands.

4. The radiometer of claim 3 wherein the two subbands comprise a first subband extending from about 26 to 40 GHz and a second subband extending from about 75 to 100 GHz.

5. The radiometer of claim 4 including frequency demultiplexers for dividing the subbands into channels, each channel extending across at least one gigahertz of frequency.

6. The radiometer of claim 5 including square-law detectors and integrators coupled to each channel for generating analog signals proportional to the sensed brightness temperature in each channel.

7. The radiometer of claim 6 including an analog to digital converter for converting the analog signals in each channel to digital format, and a multiplexer for combining the digital signals from each channel.

8. The radiometer of claim 7 including a computer for transforming the serial signal into said electrical signal proportional to radiative power versus film thickness.

9. The radiometer of claim 1 wherein the first electrical signal is measured by mixing the radiated power with a local oscillator signal to produce a signal proportional to the difference between the frequency of the radiated power and the local oscillator signal.

10. The radiometer of claim 9 wherein the first electrical signal extends over a frequency range which is divided into a first continuous subband between about 26–40 GHz and a second continuous subband of about 75–100 GHz.

11. A method for determining the thickness distribution of oil film on a body of water comprising the steps of:
   a) detecting the electromagnetic power radiated by the body of water and oil film over a range of frequencies, and generating a first electrical signal therefrom which is proportional to a brightness temperature of the water and film versus radiation frequency; and
   b) processing the first electrical signal to obtain a second electrical signal which is proportional to the radiative power versus film thickness by performing a Fourier transform process on the first electrical signal.

12. The method of claim 11 wherein the radiated power is detected over a continuous range of frequencies.

13. The method of claim 11 wherein the radiated power is coherently detected over a range of frequencies in two subbands.

14. The method of claim 13 wherein the two subbands comprise a first subband extending from about 26 to 40 GHz and a second subband extending from 75 to 100 GHz.

15. The method of claim 14 including dividing the subbands into channels, each channel extending across at least one gigahertz of frequency.

16. The method of claim 15 including generating analog signals proportional to the sensed brightness temperature of each channel.

17. The method of claim 16 including converting the analog signals in each subband to digital format and combining the digital signals from each subband.

18. The method of claim 17 including transforming the serial digital signal into said electrical signal proportional to radiative power versus film thickness.

19. The method of claim 11 wherein the first electrical signal is measured by mixing the radiated power with a local oscillator signal to produce a difference signal proportional to the difference between the frequency of the radiated power and the local oscillator signal.

20. The method of claim 19 wherein the first electrical signal extends over a frequency range which is divided into a first continuous range of about 26–40 GHz and a second continuous range of about 75–100 GHz.

* * * * *

UNITED STATES PATENT AND TRADEMARK OFFICE
CERTIFICATE OF CORRECTION

PATENT NO. : 5,381,442
DATED : January 10, 1995
INVENTOR(S) : Elliot R. Brown, Gregory G. Hogan, and Gerald M. Daniels It is certified that error appears in the above-indentified patent and that said Letters Patent is hereby corrected as shown below:

In column 2, line 62, delete "$r_0$" and insert --$n_0$--.

In column 2, line 66, equation 3, delete "n" and insert --$n_0$--.

In column 3, line 2, equation 4, delete "n" and insert --$n_0$--.

In column 3, line 8, equation 5, delete "n" and insert --$n_0$--.

In column 3, line 24, equation 6, insert --(x)-- after "$T_B$".

In column 3, line 30, equation 7, insert --(x)-- after "$T_B$".

In column 3, line 24, aquation 6, dk should be --dx--.

Signed and Sealed this

Sixth Day of June, 1995

Attest:

BRUCE LEHMAN

*Attesting Officer*    *Commissioner of Patents and Trademarks*